US012205624B2

(12) United States Patent
Yoo et al.

(10) Patent No.: US 12,205,624 B2
(45) Date of Patent: Jan. 21, 2025

(54) MRAM CELL WITH PAIR OF MAGNETIC TUNNEL JUNCTIONS HAVING OPPOSITE STATES AND MEMORY DEVICE USING THE SAME

(71) Applicant: Korea Advanced Institute of Science and Technology, Daejeon (KR)

(72) Inventors: Hoi Jun Yoo, Daejeon (KR); Wenao Xie, Daejeon (KR)

(73) Assignee: Korea Advanced Institute of Science and Technology, Daejeon (KR)

( * ) Notice: Subject to any disclaimer, the term of this patent is extended or adjusted under 35 U.S.C. 154(b) by 235 days.

(21) Appl. No.: 18/087,844

(22) Filed: Dec. 23, 2022

(65) Prior Publication Data

US 2023/0410864 A1 Dec. 21, 2023

(30) Foreign Application Priority Data

Jun. 20, 2022 (KR) .................... 10-2022-0075146

(51) Int. Cl.
*G11C 11/16* (2006.01)
(52) U.S. Cl.
CPC ........ *G11C 11/161* (2013.01); *G11C 11/1655* (2013.01); *G11C 11/1673* (2013.01); *G11C 11/1675* (2013.01)
(58) Field of Classification Search
CPC .............................. G11C 11/161; G11C 11/16
USPC ........................................................ 365/158
See application file for complete search history.

(56) References Cited

U.S. PATENT DOCUMENTS

2012/0002471 A1* 1/2012 Dexter ................. G11C 29/702
365/185.09
2019/0165045 A1* 5/2019 Chung .................... H10B 63/34

FOREIGN PATENT DOCUMENTS

KR 10-2021-0082499 A 7/2021

OTHER PUBLICATIONS

Siri Narla et al., "Modeling and Design for Magnetoelectric Ternary Content Addressable Memory (TCAM)", IEEE Journal on Exploratory Solid-State Computational Devices and Circuits, Jun. 2022, vol. 8, Issue 1, pp. 44-52.*

* cited by examiner

*Primary Examiner* — Muna A Techane
(74) *Attorney, Agent, or Firm* — Revolution IP, PLLC

(57) ABSTRACT

An MRAM cell includes a switch unit configured to determine opening and closing thereof by a word line voltage and to activate a current path between a bit line and a bit line bar in an opened state thereof, first and second MTJs having opposite states, respectively, and connected in series between the bit line and the bit line bar, to constitute a storage node, and a sensing line configured to be activated in a reading mode of the MRAM cell, thereby creating data reading information based on a voltage between the first and second MTJs, wherein the first and second MTJs have different ones of a low resistance state and a high resistance state, respectively, in accordance with a voltage drop direction between the bit line and the bit line bar, thereby storing data of 0 or 1.

15 Claims, 6 Drawing Sheets

| State | RD | RS | VPL | Vo |
|---|---|---|---|---|
| 1 | HRS | LRS | High, > Vth | Reduced |
| 0 | LRS | HRS | Low, < Vth | Maintained |

MRAM CELL WITH PAIR OF MAGNETIC TUNNEL JUNCTIONS HAVING OPPOSITE STATES AND MEMORY DEVICE USING THE SAME

BACKGROUND OF THE INVENTION

Field of the Invention

The present invention relates to a magnetoresistive random access memory (MRAM), and more particularly to an MRAM cell achieving data reading and writing reliability through inclusion of a pair of magnetic tunnel junctions having opposite states, and a memory device using the same.

Description of the Related Art

Magnetoresistive random access memory (hereinafter, referred to as "MRAM") is a non-volatile solid memory configured to store information by utilizing a variation in magnetoresistance according to a magnetization direction between ferromagnetic elements. Such MRAM not only has advantages of a dynamic random access memory (DRAM), that is, a high data processing rate, a high degree of integration, and low power consumption, but also has an advantage of a flash memory in that data is not erased even when power is turned off, and, as such, is being highlighted as a next-generation memory substitutable for the DRAM and the flash memory.

The basic element of the MRAM is a magnetic tunnel junction (hereinafter, referred to as an "MTJ") having a sandwich structure in which an insulating layer is formed between two ferromagnetic layers. The MTJ is disposed at an intersection between a word line and a bit line in a memory circuit, and a certain resistance value thereof is determined in accordance with a direction of current flowing therethrough. The MRAM stores information in the MTJ based on the resistance value. For reading the stored information, the MRAM measures a resistance state of the MTJ. That is, the MRAM is a memory configured to write or read information using a magnetoresistive effect (called "tunnel magnetoresistance (TMR)") generated at the MTJ.

FIG. 1 is a diagram illustrating a general MRAM cell structure. In particular, FIG. 1 shows an example of an MTJ structure constituting a spin transfer torque-magnetoresistive random access memory (STT-MRAM). Referring to FIG. 1, in an MTJ 10 constituting an STT-MRAM, an insulating layer 12, which may be, for example, an oxide layer, is formed among a plurality of ferroelectric layers 11 and 13. One of the plurality of ferroelectric layers 11 and 13 is a pinned layer 11 configured to always keep a magnetic direction thereof, and the other one of the plurality of ferroelectric layers 11 and 13 is a free layer configured to change a magnetic direction thereof by bidirectional current flowing therethrough.

The MTJ 10 exhibits a resistance determined by relative magnetic directions of the two ferromagnetic layers 11 and 13 determined in accordance with the direction of current flowing through the MTJ 10. That is, when the magnetic directions of the two ferromagnetic layers 11 and 13 are parallel, the MTJ 10 has a state having a low resistance Rp (referred to as a "low resistance state (LRS)"). On the other hand, when the magnetic directions of the two ferromagnetic layers 11 and 13 are anti-parallel, the MTJ 10 has a state having a high resistance Rap (referred to as a "high resistance state (HRS)").

In order to store data in the MTJ 10 as mentioned above, the magnetic direction of the free layer 13 should be changed.

FIGS. 1(a) and 1(b) show an example in which the magnetic direction of the free layer 13 is changed by bidirectional current flowing between the pinned layer 11 and the free layer 13 of the MTJ 10. That is, when current $T_{AP \rightarrow P}$ larger than a critical value flows in a direction from the free layer 13 to the pinned layer 11 under the condition that the MTJ 10 has a state in which magnetic directions of the pinned layer 11 and the free layer 13 are anti-parallel, that is, a high resistance state (HRS), as shown in FIG. 1(a), the MTJ 10 is switched to a state in which magnetic directions of the pinned layer 11 and the free layer 13 are parallel, that is, a low resistance state (LRS) (hereinafter, referred to as an "LRS"), in accordance with a set process, as shown in FIG. 1(b). In this case, the MTJ 10 represents logic "0".

On the other hand, when current $I_{P \rightarrow AP}$ larger than the critical value flows in a direction from the pinned layer 11 to the free layer 13 under the condition that the MTJ 10 has a state in which magnetic directions of the pinned layer 11 and the free layer 13 are parallel, that is, a low resistance state (LRS), as shown in FIG. 1(b), the MTJ 10 is switched to a state in which magnetic directions of the pinned layer 11 and the free layer 13 are anti-parallel, that is, a high resistance state (HRS) (hereinafter, referred to as an "HRS"), in accordance with a reset process, as shown in FIG. 1(a). In this case, the MTJ 10 represents logic "1".

Thus, the MRAM determines a resistance state of the MTJ 10 by flowing current through two lines intersecting each other in each cell, and stores and reads information based on the determined resistance state.

In this case, a resistance difference between a low resistance value Rp and a high resistance value Rap is defined as a tunnel magnetoresistance ratio (TMR), as expressed by Expression 1. The TMR is typically determined by a value of several ten % or several hundred % in accordance with kinds of materials constituting the magnetic layers 11 and 13 and the insulating layer 12. As the value of the TMR is higher, reliability of the MRAM is enhanced.

$$TMR = \frac{R_{AP} - R_P}{R_P} \qquad \text{[Expression 1]}$$

Conventionally, the TMR is typically limited to 200% or less. For this reason, when the TMR is low, that is, when the resistance difference between the HRS and the LRS is small, it is difficult to classify the state of the MTJ based on the resistance values Rap and Rp. As a result, there is a problem in that reliability of data writing or reading is degraded.

In addition, when the MTJ is deformed during a manufacturing process thereof, the resistance values Rap and RP may be varied. However, such variation cannot be estimated and, as such, there may be a problem in that negative influence on data storage and access functions of the MTJ occurs.

Furthermore, when the MTJ is manufactured in accordance with the related art, the resistance values Rap and Rp may be beyond designed reference values thereof due to a limited technology level. However, these deviations cannot be estimated, and may take resistance values greater or smaller than standard values, respectively. For this reason, the resistance difference between the HRS and the LRS may be within a considerably narrowed range and, as such, distinguishment thereof may be difficult. As a result, increased negative influence on data storage and access functions of the MTJ may occur.

RELATED ART LITERATURE

Patent Documents

Patent Document 1: Korean Unexamined Patent Publication No. 10-2021-0082499

SUMMARY OF THE INVENTION

Therefore, the present invention has been made in view of the above mentioned problems, and an object of the invention is to provide a magnetoresistive random access memory (MRAM) cell capable of enhancing a function for distinguishing data states of 1 and 0 from each other, thereby enhancing reliability of data writing or reading, by providing a data writing and reading method based on a new type MRAM cell structure through inclusion of a pair of magnetic tunnel junctions (MTJs) having opposite states, and a memory device using the MRAM cell.

Another object of the present invention is to provide an MRAM cell in which states of a pair of magnetic tunnel junctions (MTJs) having opposite states are changed to different ones of a low resistance state (LRS) and a high resistance state (HRS), respectively, in accordance with voltage drop directions of a bit line (BL) and a bit line bar (BLB), and data of 0 or 1 is then stored based on information of the changed states, thereby being capable of enhancing writing reliability without being influenced by absolute values of a high resistance value (Rap) and a low resistance value (Rp) and, as such, without being influenced by deformation occurring in an MTJ manufacturing procedure, and a memory device using the MRAM cell.

Another object of the present invention is to provide an MRAM cell in which data reading information is created based on a voltage between a pair of magnetic tunnel junctions (MTJs) respectively having different ones of a low resistance state (LRS) and a high resistance state (HRS), thereby being capable of rapidly and stably reading previously-stored data and, as such, enhancing data reading reliability, and a memory device using the MRAM cell.

In accordance with an aspect of the present invention, the above and other objects can be accomplished by the provision of a magnetoresistive random access memory (MRAM) cell including a switch unit configured to determine opening and closing thereof by a word line voltage and to activate a current path between a bit line and a bit line bar in an opened state thereof, first and second magnetic tunnel junctions (MTJs) having opposite states, respectively, the first and second MTJs being connected in series between the bit line and the bit line bar, to constitute a storage node, and a sensing line configured to be activated in a reading mode of the MRAM cell, thereby creating data reading information based on a voltage between the first and second MTJs.

In accordance with a further aspect of the present invention, there is provided a memory device using a magnetoresistive random access memory (MRAM) cell, the memory device including a plurality of MRAM cells 100 disposed in an m×n matrix, a word line driver configured to generate m word line voltages for determination of operation modes of corresponding ones of the MRAM cells, and a control voltage generator configured to generate a control voltage for control of an operation of each of the MRAM cells and determination of data to be stored in each of the MRAM cells, the control voltage including n bit line voltages and n bit line bar voltages, wherein each of the MRAM cells includes a switch unit configured to determine opening and closing thereof by a corresponding one of the word line voltages and to activate a current path between a bit line and a bit line bar in an opened state thereof, a storage node including first and second magnetic tunnel junctions (MTJs) having opposite states, respectively, the first and second MTJs being connected in series between the bit line and the bit line bar, and a sensing line configured to be activated in a reading mode of the MRAM cell, thereby creating data reading information based on a voltage between the first and second MTJs.

The MRAM cell and the memory device using the same include a pair of magnetic tunnel junctions (MTJs) having opposite states, and store data based on a relative resistance ratio between the pair of MTJs. Accordingly, it may be possible to enhance the ability to distinguish between two data states '1' and '0', as such, there is an effect of enhancing reliability of data writing or reading.

In addition, in the MRAM cell and the memory device using the same, states of the pair of MTJs having opposite states are changed to different ones of a low resistance state (LRS) and a high resistance state (HRS), respectively, in accordance with voltage drop directions of a bit line (BL) and a bit line bar (BLB), and data of 0 or 1 is then stored based on information of the changed states. Accordingly, there is an effect of enhancing writing reliability without being influenced by absolute values of a high resistance value (Rap) and a low resistance value (Rp) and, as such, without being influenced by deformation occurring in an MTJ manufacturing procedure.

In addition, in the MRAM cell and the memory device using the same, data reading information is created based on a voltage between the pair of MTJs respectively having different ones of the LRS and the HRS. Accordingly, there is an effect of rapidly and stably reading previously-stored data and, as such, enhancing data reading reliability.

BRIEF DESCRIPTION OF THE DRAWINGS

The above objects, and other features and advantages of the present invention will become more apparent after a reading of the following detailed description when taken in conjunction with the drawings, in which.

DESCRIPTION OF THE PREFERRED EMBODIMENTS

Figure 1:
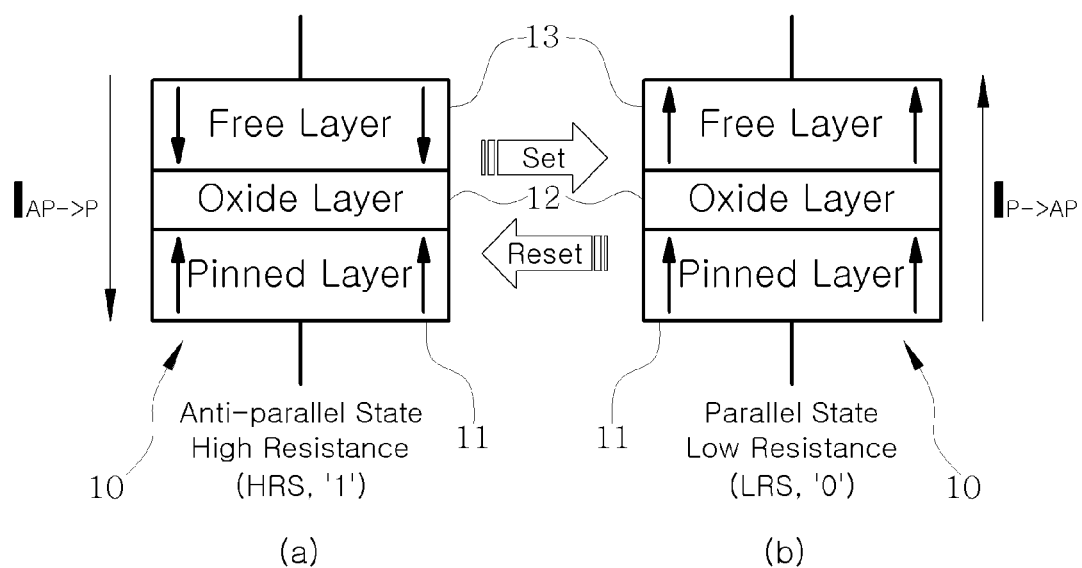
FIG. 1 is a diagram illustrating a general magnetoresistive random access memory (MRAM) cell structure.

Reference will now be made in detail to embodiments of the present invention, examples of which are illustrated in the accompanying drawings, in order to enable those skilled in the art to easily implement the present invention. However, the present invention may be embodied in many different forms and should not be construed as limited to the embodiments set forth herein. Matters having no concern with the present invention will be omitted, for clarity of explanation. The same or similar elements throughout the specification are designated by the same reference numerals. In the following description, when the detailed description of the relevant known function or configuration is determined to unnecessarily obscure the important point of the present disclosure, the detailed description will be omitted.

Throughout the specification and the claims, the terms "including", "comprising", "having" and variations thereof mean "including but not limited to" unless expressly specified otherwise, and, as such, should not be construed to exclude elements other than the elements disclosed herein and should be construed to further include additional elements.

Figure 2:
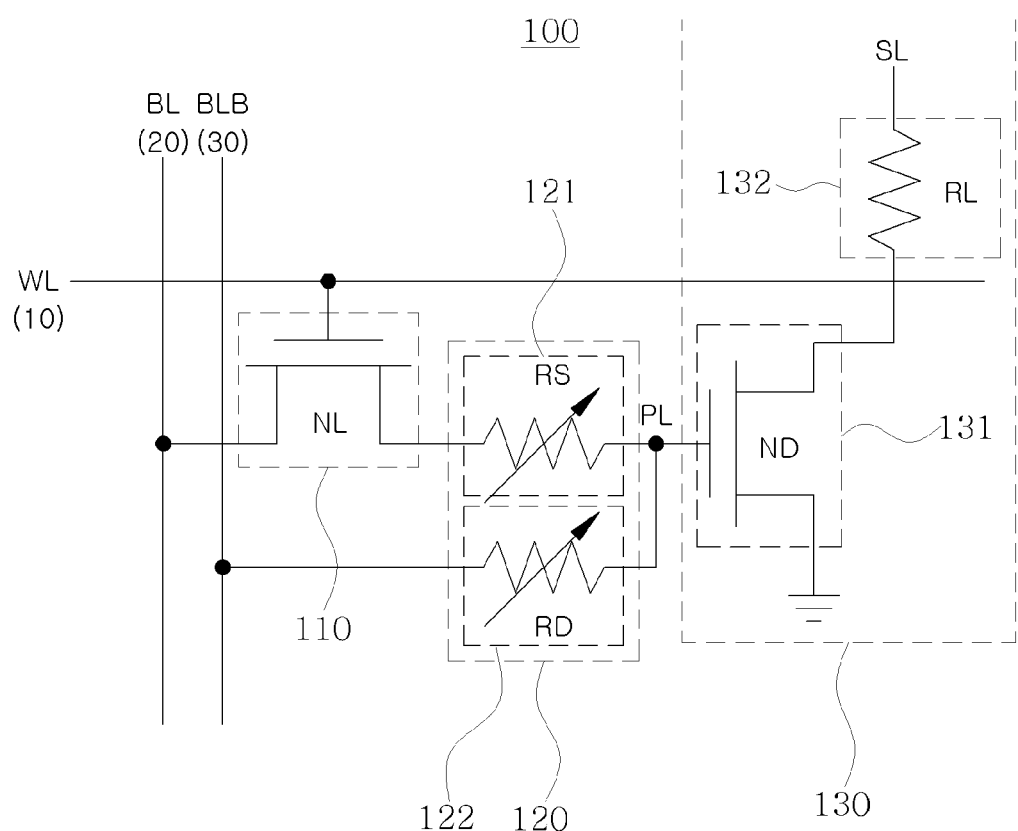
FIG. 2 is a circuit diagram showing an MRAM cell according to an exemplary embodiment of the present invention.

FIG. 2 is a circuit diagram showing a magnetoresistive random access memory (MRAM) cell according to an exemplary embodiment of the present invention. Referring to FIG. 2, the MRAM cell according to the exemplary embodiment of the present invention includes an NMOS transistor (NL) 110 configured to control a reading or writing operation of the MRAM cell, a storage node 120 configured to store data of 1 or 0 in a writing mode of the MRAM cell, and a sensing line 130 configured to sense data stored in the storage node 120 in a reading mode of the MRAM cell.

The NMOS transistor (NL) 110 is determined to be opened or closed in accordance with a voltage of a word line (WL) 10 and, as such, controls a reading or writing operation of a cell corresponding thereto. For this function, the NMOS transistor (NL) 110 is connected, at a gate thereof, to the word line (WL) 10 while being connected, at a drain thereof, to a bit line (BL) 20 and connected, at a source thereof, to the storage node 120. That is, the NMOS transistor (NL) 110 is opened when a voltage higher than a threshold voltage of the NMOS transistor (NL) 110 is applied to the NMOS transistor (NL) 110 through the word line (WL) 10, the NMOS transistor (NL) 110 activates a current path from the bit line (BL) 20 to a bit line bar (BLB) 30. In this case, a reading or writing operation of the cell is possible. On the other hand, when a ground voltage GND is supplied to the word line (WL) 10, the NMOS transistor (NL) 110 is closed. In this case, there is no current flowing to the storage node 120 and, as such, information previously stored in the cell is maintained.

The storage node 120 stores data in a writing mode of the cell. For this function, the storage node 120 is configured through inclusion of first and second magnetic tunnel junctions (MTJ1 and MTJ2) 121 and 122 connected in series between the bit line (BL) 20 and the bit line bar (BLB) 30. In this case, each of the first and second magnetic tunnel junctions (MTJ1 and MTJ2) 121 and 122 has a state determined by a direction of current determined in accordance with a direction of voltage drop between the bit line (BL) 20 and the bit line bar (BLB) 30. Accordingly, the first and second magnetic tunnel junctions (MTJ1 and MTJ2) 121 and 122 have different ones of a low resistance state (LRS) (hereinafter, referred to as an "LRS") and a high resistance state (HRS) (hereinafter, referred to as an "HRS"), respectively. In the example of FIG. 2, the first and second magnetic tunnel junctions (MTJ1 and MTJ2) 121 and 122 are represented by variable resistors (RS and RD) 121 and 122, respectively. In the following description, the first magnetic tunnel junction (MTJ1) 121 is simply referred to as an RS 121", and the second magnetic tunnel junction (MTJ2) 122 is simply referred to as an RD 122".

In order to set the RS 121 and the RD 122 such that the RS 121 and the RD 122 have different states, that is, opposite magnetic directions, respectively, the RS 121 and the RD 122 should have different orders of a free layer and a pinned layer in terms of current direction, respectively. Such structures of the RS 121 and the RD 122 are illustrated in FIG. 3.

Figure 3:
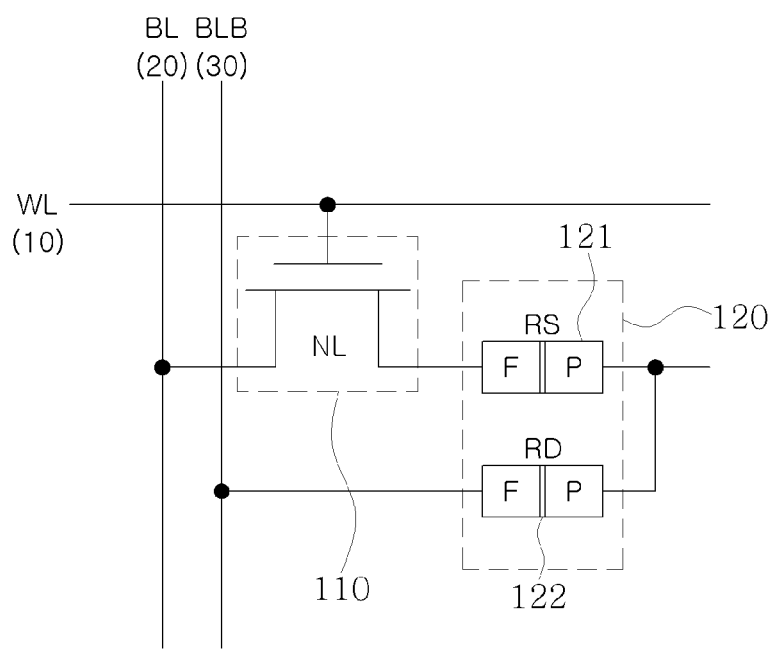
FIG. 3 is a circuit diagram schematically showing a pair of magnetic tunnel junctions according to an exemplary embodiment of the present invention.

FIG. 3 is a circuit diagram schematically showing the pair of magnetic tunnel junctions according to an exemplary embodiment of the present invention. Referring to FIG. 3, the RS 121 includes a free layer F formed at the side of the bit line (BL) a pinned layer P formed at the side of the RD 122, and an insulating layer formed therebetween, and the RD 122 includes a free layer F formed at the side of the bit line bar (BLB) 30, a pinned layer P formed at the side of the RS 121, and an insulating layer formed therebetween.

Accordingly, when current flows in a direction from the bit line (BL) 20 to the bit line bar (BLB) 30, the RS 121 has an LRS, and the RD 122 has an HRS. When the flowing direction of current is reversed, the RS 121 has an HRS, and the RD 122 has an LRS. The MRAM cell according to the exemplary embodiment of the present invention stores data of 1 or 0 using characteristics as described above. That is, when the RS 121 has an LRS, and the RD 122 has an HRS, data of 1 is stored in the storage node 120. In the case opposite to the above-described case, data of 0 is stored. Such a data writing operation will be described later with reference to FIG. 4.

The sensing line 130 is activated in a reading mode of the MRAM cell and, as such, creates data reading information based on a voltage between the RS 121 and the RD 122. For this function, the sensing line 130 is configured through inclusion of an NMOS transistor (ND) 131 and a load resistor (RL) 132 connected in series between a power source and the ground.

The NMOS transistor (ND) 131 is a transistor cell used to sense states of the RS 121 and the RD 122. A voltage $V_{PL}$ between the RS 121 and the RD 122 is applied to a gate of the NMOS transistor (ND) 131. The gate voltage of the NMOS transistor (ND) 131 is varied in accordance with a relative resistance ratio between the RS 121 and the RD 122. The NMOS transistor (ND) 131 is opened when the gate voltage of the NMOS transistor (ND) 131 exceeds a threshold voltage of the NMOS transistor (ND) 131. Accordingly, the gate voltage of the NMOS transistor (ND) 131 may be used as a measure of data stored in the storage node 120.

Meanwhile, the NMOS transistor (ND) 131 is connected, at a source thereof, to the ground while being connected, at a drain thereof, to the load resistor (RL) 132. In order to activate the sensing line 130 only in the reading mode of the MRAM cell, power SL is supplied to the other side of the load resistor (RL) 132 in the reading mode of the MRAM cell, whereas the other side of the load resistor (RL) 132 is connected to the ground in a writing mode of the MRAM cell. When the other side of the load resistor (RL) 132 is connected to the ground in the writing mode of the MRAM cell, unnecessary current flow is prevented and, as such, power saving is achieved.

Meanwhile, the NMOS transistor (ND) 131 is opened when data of 1 is stored in the storage node 120, thereby causing the drain voltage thereof to drop. On the other hand, the NMOS transistor (ND) 131 is closed when data of 0 is stored in the storage node 120, thereby causing the drain voltage thereof to be maintained. Accordingly, an external sensing circuit (for example, an ADC, etc.) may read data stored in the storage node 120 by sensing a voltage variation as described above. Such a data reading operation will be described later with reference to FIG. 5.

Figure 4:
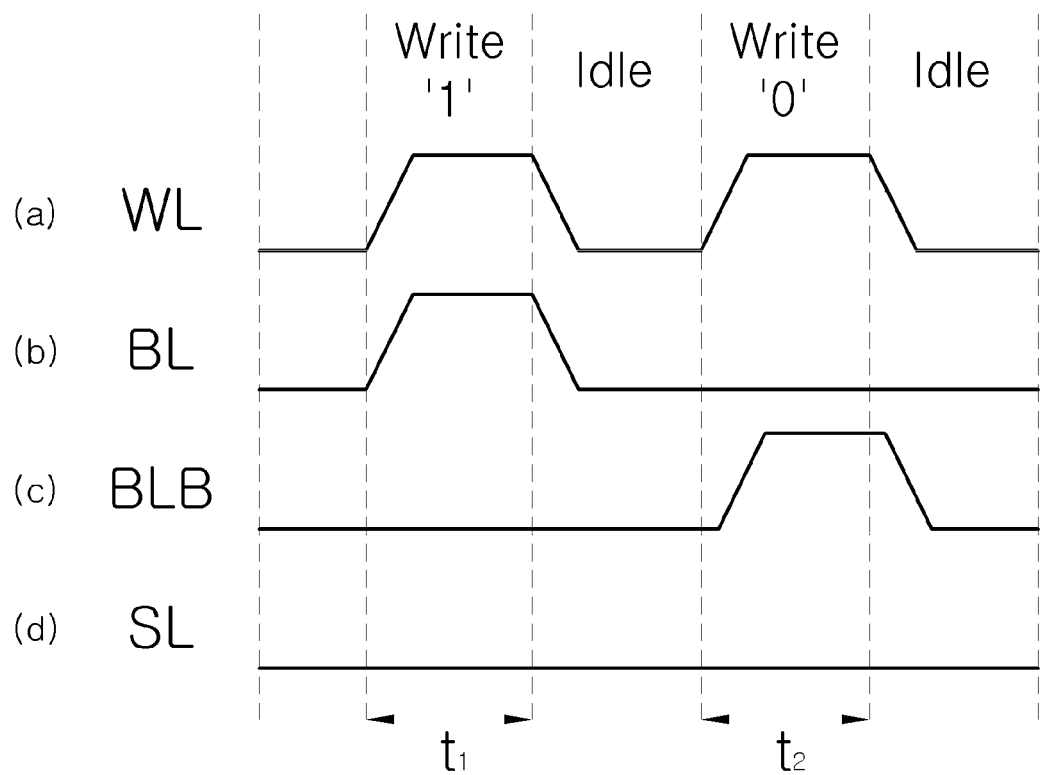
FIG. 4 is a timing diagram of control voltages applied in a writing mode of the MRAM cell according to the exemplary embodiment of the present invention.

FIG. 4 is a timing diagram of control voltages applied in the writing mode of the MRAM cell according to the exemplary embodiment of the present invention. FIG. 4 illustrates timings of a word line voltage $V_{WL}$ (a), a bit line voltage $V_{BL}$ (b), a bit line bar voltage $V_{BLB}$ (c), and a sensing line voltage $V_{SL}$ (d). The sensing line voltage $V_{SL}$ is a voltage applied to the sensing line 130 illustrated in FIG. 2. This voltage is generated when predetermined power is supplied to the other side of the load resistor (RL) 132.

Referring to FIGS. 2 to 4, first, for the writing operation of the MRAM cell, the word line voltage $V_{WL}$ (a) is maintained at a level higher than the threshold voltage of the NMOS transistor (NL) 110 in first and second writing periods $t_1$ and $t_2$. Accordingly, the NMOS transistor (NL) 110 is opened, thereby activating a current path from the bit line (BL) 20 to the bit line bar (BLB) 30.

When it is desired to write data of 1 in the storage node 120, voltage drop from the bit line (BL) 20 to the bit line bar (BLB) 30 is generated in order to generate a flow of current from the free layer F to the pinned layer P in the RS 121 and a flow of current from the pinned layer P to the free layer F in the RD 122. To this end, a predetermined voltage is applied to the bit line (BL) 20, and the bit line bar (BLB) 30 is connected to the ground GND (cf. the first writing period t1). In this case, the RS 121 and the RD 122 are set to an LRS and an HRS, respectively, and, as such, data of 1 may be stored in the storage node 120.

On the other hand, when it is desired to write data of 0 in the storage node 120, voltage drop from the bit line bar (BLB) 30 to the bit line (BL) 20 is generated in order to generate a flow of current from the pinned layer P to the free layer F in the RS 121 and a flow of current from the free layer F to the pinned layer P in the RD 122. To this end, the bit line (BL) 20 is connected to the ground GND, and a predetermined voltage is applied to the bit line bar (BLB) 30 (cf. the second writing period t2). In this case, the RS 121 and the RD 122 are set to an HRS and an LRS, respectively, and, as such, data of 0 may be stored in the storage node 120.

The predetermined voltage applied to each of the bit line (BL) 20 and the bit line bar (BLB) 30 is a voltage value variable by a corresponding one of the MTJs, and is associated with a process. This voltage may be expressed by a variable Vwrite which is not fixed to a specific value.

Thus, data of 1 may be stored when the RS 121 and the RD 122 are in the LRS and the HRS, respectively, because a voltage $V_{PL}$ generated at a node PL between the RS 121 and the RD 122 is higher than the threshold voltage of the ND 131, thereby opening the ND 131, and, as such, a voltage drop in the RL 132 may be sensed. On the other hand, data of 0 may be stored when the RS 121 and the RD 122 are in the HRS and the LRS, respectively, because the voltage $V_{PL}$ generated at the node PL is lower than the threshold voltage of the ND 131, thereby closing the ND 131, and, as such, no voltage drop in the RL 132 will be sensed.

Meanwhile, in the writing mode of the MRAM cell, the sensing line 130 is connected to the ground GND, thereby causing the voltage $V_{SL}$ (d) to be maintained at a low level, in order to preventing current from flowing through the sensing line 130. In addition, after the writing operation, all of the word line voltage $V_{WL}$ (a), the bit line voltage $V_{BL}$ (b), and the bit line bar voltage $V_{BLB}$ (c) are connected to the ground GND in order to avoid writing disturbance and to save energy (cf. a period between the first and second writing periods $t_1$ and $t_2$).

Figures 5, 6:
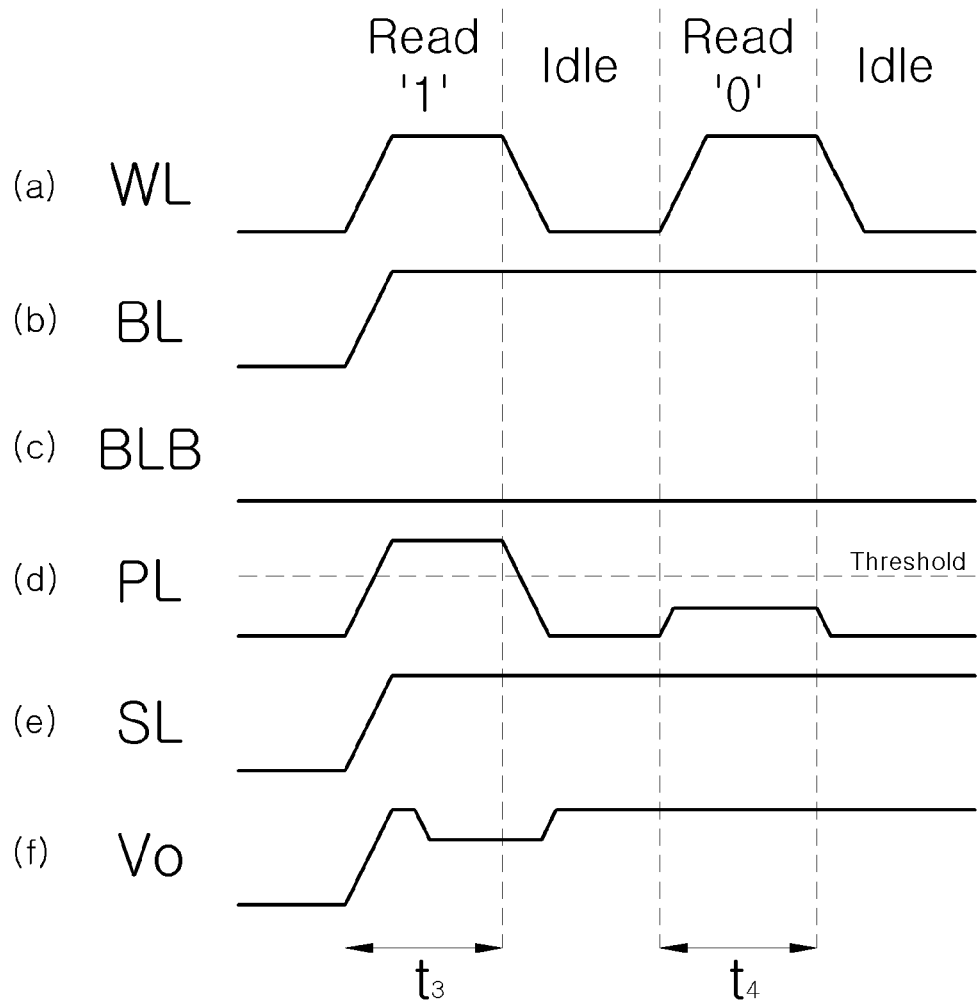
FIG. 5 is a timing diagram of control voltages applied in a reading mode of the MRAM cell according to the exemplary embodiment of the present invention.
FIG. 6 is a table representing parameters corresponding to data values stored in the MRAM cell according to the exemplary embodiment of the present invention.

FIG. 5 is a timing diagram of control voltages applied in the reading mode of the MRAM cell according to the exemplary embodiment of the present invention. FIG. 5 illustrates timings of a word line voltage $V_{WL}$ (a), a bit line voltage $V_{BL}$ (b), a bit line bar voltage $V_{BLB}$ (c), a voltage $V_{PL}$ (d) between the RS 121 and the RD 122 illustrated in FIGS. 2 and 3, a sensing line voltage $V_{SL}$ (e), and a drain voltage $V_O$ (f) of the NMOS transistor (ND) 131 illustrated in FIG. 2. The sensing line voltage $V_{SL}$ is a voltage applied to the sensing line 130 illustrated in FIG. 2. This voltage is generated when predetermined power is supplied to the other side of the load resistor (RL) 132. In addition, the drain voltage $V_O$ (f) of the NMOS transistor (ND) 131 is data reading information. An external sensing circuit (for example, an ADC, etc.) may determine whether data stored in the storage node 120 is 1 or 0 by sensing a variation in the drain voltage $V_O$ (f).

Referring to FIGS. 2, 3, and 5, first, for a reading operation of the MRAM cell, the word line voltage $V_{WL}$ (a) is maintained at a level higher than the threshold voltage of the NMOS transistor (NL) 110 in first and second writing periods $t_1$ and $t_2$. Accordingly, the NMOS transistor (NL) 110 is opened, thereby activating the current path from the bit line (BL) 20 to the bit line bar (BLB) 30.

In addition, the sensing line voltage $V_{SL}$ (e) is set to a rather high fixed voltage (for example, 0.5 V, 0.8 V, 1 V, etc.), to ensure that the NMOS transistor (ND) 131 can operate well in a sufficient range for sensing.

In addition, in the reading mode of the MRAM cell, a predetermined voltage (for example, 0.6V) is applied to the bit line (BL) 20, and the bit line bar (BLB) 30 is connected to the ground GND, in order to generate a voltage drop from the bit line (BL) 20 to the bit line bar (BLB) 30, thereby enabling current to flow from the bit line (BL) 20 to the bit line bar (BLB) 30. In this case, the bit line voltage $V_{BL}$ (b) is preferably maintained at a level lower than a voltage in the first writing period $t_1$ illustrated in FIG. 4, in order to prevent overwriting of the RS 121 and the RD 122.

When the bit line voltage $V_{BL}$ (b) is maintained at a level lower than the voltage in the first writing period $t_1$, a writing operation is not performed because the voltage applied to the RS 121 and the RD 122 (that is, a read voltage Vread) is lower than a write voltage Vwrite and, as such, states of the RS 121 and the RD 122 are maintained without being varied.

When the MRAM cell operates in the reading mode in accordance with the above-described setting, the RS 121 and the RD 122 may be regarded as normal resistor cells. In addition, the gate voltage and the drain voltage of the NMOS transistor (NL) 110 are fixed, and the total resistance of the RS 121 and the RD 122, which is determined by the voltage drop between the bit line (BL) 20 and the bit line bar (BLB) 30, is also almost fixed. Accordingly, the voltage drop from the source side of the bit line (BL) 20 to the bit line bar (BLB) 30, which is shared by the RS 121 and the RD 122, is almost fixed.

Hereinafter, a reading operation of the MRAM cell under the above-described conditions will be described.

First, in the case in which data of 1 is stored in the MRAM cell, the RS 121 and the RD 122 are in the LRS and the HRS, respectively. Accordingly, the RD 122 shares a voltage in a higher rate than that of the RS 121, and the node PL between the RS 121 and the RD 122 has a voltage higher than the threshold voltage of the NMOS transistor (ND) 131. In this case, the NMOS transistor (ND) 131 is opened and, as such, current flowing from the drain side to the source side of the NMOS transistor (ND) 131 is activated. When it is taken into consideration that the drain of the NMOS transistor (ND) 131 is connected to a path where the load resistor (RL) 132 is disposed, a voltage drop is generated at the load resistor (RL) 132 when the current flowing from the drain side to the source side of the NMOS transistor (ND) 131 is activated. As a result, the drain voltage of the NMOS transistor (ND) 131 drops in a considerable magnitude (cf. the first reading period $t_3$). Such a voltage variation is used as data reading information for reading of data of 1. That is, the external sensing circuit (for example, an ADC, etc.) senses such a voltage variation and, as such, reads that data of 1 is stored in the storage node 120.

On the other hand, in the case in which data of 0 is stored in the MRAM cell, the RS 121 and the RD 122 are in the HRS and the LRS, respectively. Accordingly, the RS 121 shares a voltage in a higher rate than that of the RD 122, and the node PL between the RS 121 and the RD 122 has a voltage lower than the threshold voltage of the NMOS transistor (ND) 131. In this case, the NMOS transistor (ND) 131 is closed and, as such, current flowing from the drain side to the source side of the NMOS transistor (ND) 131 is not activated. Although a voltage drop is generated at the load resistor (RL) 132 in this case, the drain voltage of the NMOS transistor (ND) 131 is maintained at the same level as that of the sensing line voltage $V_{SL}$. (cf. a second reading period $t_4$). Such a voltage state is used as data reading information for reading of data of 0. That is, the external sensing circuit (for example, an ADC, etc.) senses such a voltage variation and, as such, reads that data of 0 is stored in the storage node 120.

Thus, the NMOS transistor (ND) 131 included in the sensing line 130 is turned on when the RS 121 is in the LRS, and the RD 122 is in the HRS and, as such, creates data-1 reading information. On the other hand, when the RS 121 is in the HRS, and the RD 122 is in the LRS, the NMOS transistor (ND) 131 is turned off and, as such, creates data-0 reading information.

For correct reading of data of 1 and data of 0 in the reading mode of the MRAM cell, the MRAM cell is required to suitably adjust an applied voltage and a resistance value in the writing mode.

For example, when the MRAM cell stores data of 1, respective voltages of the word line (WL) 10, the bit line (BL) 20, and the bit line bar (BLB) 30 may be suitably adjusted such that the voltage $V_{PL}$ of the node PL is higher than the threshold voltage of the NMOS transistor (ND) 131. On the other hand, when the MRAM cell stores data of 0, respective voltages of the word line (WL) 10, the bit line (BL) 20, and the bit line bar (BLB) 30 may be suitably adjusted such that the voltage $V_{PL}$ of the node PL is lower than the threshold voltage of the NMOS transistor (ND) 131. At the same time, the sensing line voltage $V_{SL}$ and the resistance of the load resistor (RL) 132 are adjusted in accordance with physical characteristics of the NMOS transistor (ND) 131. Accordingly, there is no voltage variation when the NMOS transistor (ND) 131 is closed, and it may be possible to obtain a sufficient voltage drop in the load resistor (RL) 132 only when the NMOS transistor (ND) 131 is opened.

That is, the sensing line voltage $V_{SL}$ is set to 0.5 V, and the resistance of the load resistor (RL) 132 is adjusted to 40 kΩ. Thus, when the MRAM cell stores data of 1, the voltage $V_{PL}$ of the node PL is set to 50 mV larger than the threshold voltage of ND, and, as such, a voltage drop of 30 mV may be obtained in the load resistor (RL) 132. Otherwise, when the MRAM cell stores data of 0, the voltage $V_{PL}$ of the node PL is set to 50 mV smaller than the threshold voltage of ND, and, as such, no voltage drop will be obtained in the load resistor (RL) 132.

FIG. 6 is a table representing parameters corresponding to data values stored in the MRAM cell according to the exemplary embodiment of the present invention. FIG. 6 shows main parameters according to data stored in the storage node 120.

Referring to FIGS. 2 to 6, in the case in which data of 1 is stored in the storage node 120, there are features in that the RS 121 and the RD 122, which constitute the storage node 120, are in the LRS and the HRS, respectively, the voltage $V_{PL}$ at the node PL between the RS 121 and the RD 122 is higher than the threshold voltage of the NMOS transistor (ND) 131, and the drain voltage $V_O$ of the NMOS transistor (ND) 131 is reduced. On the other hand, in the case in which data of 0 is stored in the storage node 120, there are features in that the RS 121 and the RD 122, which constitute the storage node 120, are in the HRS and the LRS, respectively, the voltage $V_{PL}$ at the node PL between the RS 121 and the RD 122 is lower than the threshold voltage of the NMOS transistor (ND) 131, and the drain voltage $V_O$ of the NMOS transistor (ND) 131 is maintained.

Figure 7:
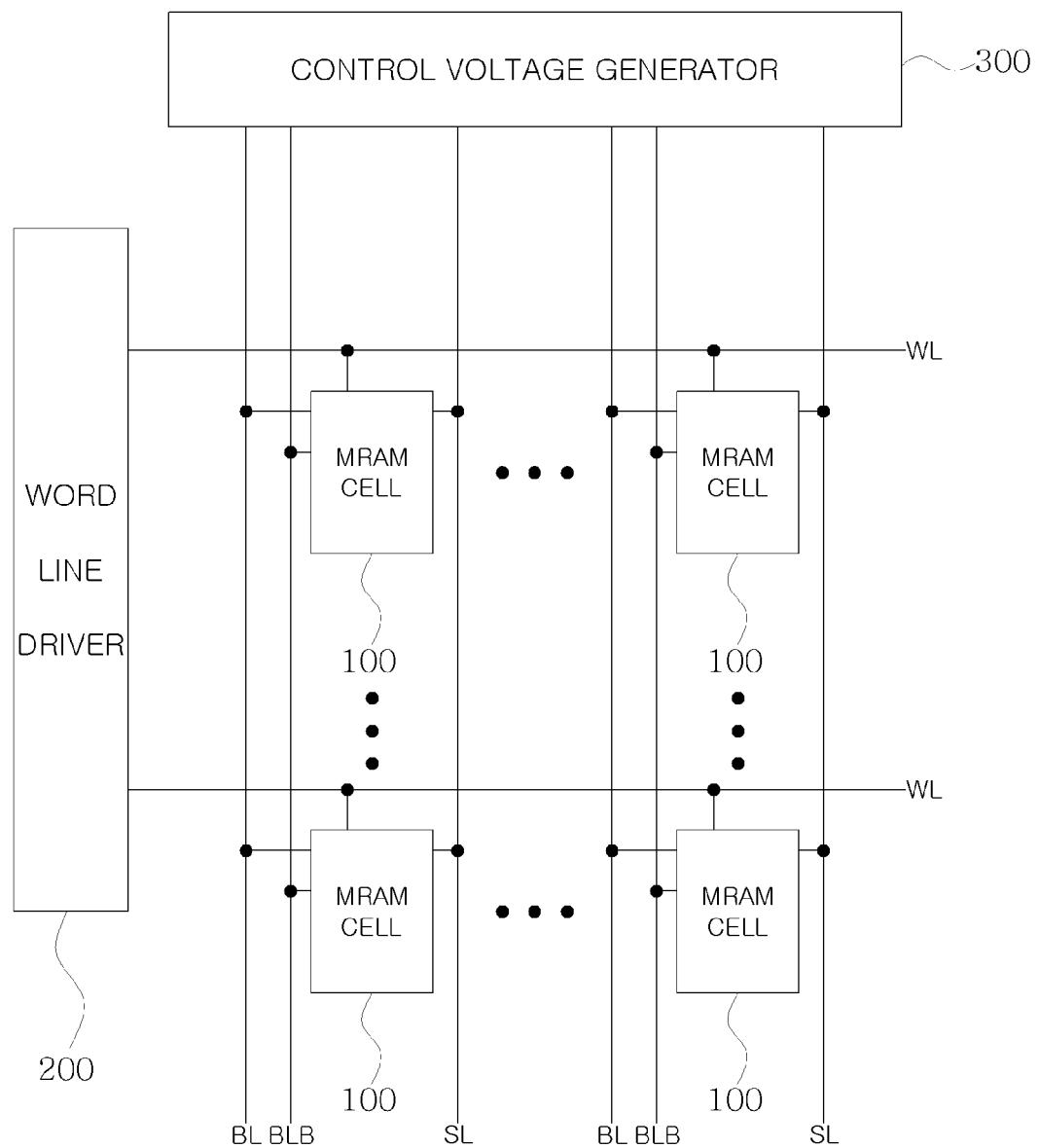
FIG. 7 is a diagram illustrating an example of a memory device including a plurality of MRAM cells disposed in a two-dimensional matrix in accordance with an exemplary embodiment of the present invention.

FIG. 7 is a diagram illustrating an example of a memory device including a plurality of MRAM cells disposed in a two-dimensional matrix in accordance with an exemplary embodiment of the present invention. Referring to FIGS. 2, 4, 5, and 7, the memory device according to the exemplary embodiment of the present invention includes a plurality of MRAM cells 100 disposed in an m×n matrix, a word line driver 200, and a control voltage generator 300.

The configuration and operation of each of the MRAM cells 100 are identical to those described with reference to FIGS. 2 to 6 and, as such, no overlapping description thereof will be given.

The word line driver 200 generates m word line (WL) voltages for determination of operation modes of corresponding ones of the MRAM cells 100, and transmits the word line (WL) voltages to the corresponding MRAM cells 100 through word lines (WL) 10, respectively. In this case, the word line driver 200 generates a predetermined word line voltage (FIG. 4(a) and FIG. 5(a)) for control of opening and closing of the NMOS transistor (NL) 110 in the writing periods $t_1$ and $t_2$ and the reading periods $t_3$ and $t_4$ of each MRAM cell 100, as illustrated in FIGS. 4 and 5. In this case, a voltage higher than the threshold voltage of the NMOS transistor (NL) 110 is generated and, as such, current flows between the bit line (BL) 20 and the bit line bar (BLB) 30.

Meanwhile, as illustrated in FIGS. 4 and 5, the word line driver 200 applies a ground voltage GND in all periods, except for the writing periods $t_1$ and $t_2$ and the reading periods $t_3$ and $t_4$ of the MRAM cell 100. Accordingly, flow of current between the bit line (BL) 20 and the bit line bar (BLB) 30 is prevented and, as such, states of the RS 121 and the RD 122 are maintained.

The control voltage generator 300 generates a control voltage for control of an operation of each of the MRAM cells 100 and determination of data to be stored in each of the MRAM cells 100. The control voltage generator 300 also generates n bit line (BL) voltages, n bit line bar (BLB) voltages, and n sensing line voltages $V_{SL}$.

In particular, when each of the MRAM cells 100 is in a writing mode, the control voltage generator 300 generates a bit line (BL) voltage (b) and a bit line bar (BLB) voltage (c) while generating a ground voltage as a sensing line voltage $V_{SL}$ (d), as illustrated in FIG. 4, in order to generate a voltage drop between the bit line (BL) and the bit line bar (BLB), for writing of data of 1 or data of 0.

On the other hand, when each of the MRAM cell 100 is in a reading mode, the control voltage generator 300 generates a predetermined bit line (BL) voltage (b) while connecting the bit line bar (BLB) voltage (c) to the ground, as illustrated in FIG. 5, in order to generate a voltage drop in a direction from the bit line (BL) to the bit line bar (BLB). In this case, the control voltage generator 300 generates a bit line (BL) voltage (b) lower than the bit line (BL) voltage (b) in the first writing period $t_1$ illustrated in FIG. 4, in order to prevent overwriting of the RS 121 and the RD 122.

In addition, the control voltage generator 300 may generate a rather high fixed voltage as the sensing line voltage $V_{SL}$, in order to enable the NMOS transistor (ND) 131 to operate in a sufficient range for sensing, that is, to enable generation of a sufficient voltage difference when the NMOS transistor (ND) 131 is opened, as illustrated in FIG. 2.

As apparent from the above description, the MRAM cell and the memory device using the same according to the exemplary embodiments of the present invention include a pair of magnetic tunnel junctions (MTJs) having opposite states, and store data based on a relative resistance ratio between the pair of MTJs. Accordingly, it may be possible to enhance the ability to distinguish between two data states '1' and '0', as such, there is an effect of enhancing reliability of data writing or reading.

In addition, in the MRAM cell and the memory device using the same according to the exemplary embodiments of the present invention, states of the pair of MTJs having opposite states are changed to different ones of a low resistance state (LRS) and a high resistance state (HRS), respectively, in accordance with voltage drop directions of a bit line (BL) and a bit line bar (BLB), and data of 0 or 1 is then stored based on information of the changed states. Accordingly, there is an effect of enhancing writing reliability without being influenced by absolute values of a high resistance value (Rap) and a low resistance value (Rp) and, as such, without being influenced by deformation occurring in an MTJ manufacturing procedure.

In addition, in the MRAM cell and the memory device using the same according to the exemplary embodiments of the present invention, data reading information is created based on a voltage between the pair of MTJs respectively having different ones of the LRS and the HRS. Accordingly, there is an effect of rapidly and stably reading previously-stored data and, as such, enhancing data reading reliability.

Although the preferred embodiments of the invention have been disclosed for illustrative purposes, those skilled in the art will appreciate that various modifications, additions and substitutions are possible, without departing from the scope and spirit of the invention as disclosed in the accompanying claims.

What is claimed is:

1. A magnetoresistive random access memory (MRAM) cell comprising:
   a switch unit configured to determine opening and closing thereof by a word line voltage and to activate a current path between a bit line and a bit line bar in an opened state thereof;
   first and second magnetic tunnel junctions (MTJs) having opposite states, respectively, the first and second MTJs being connected in series between the bit line and the bit line bar, to constitute a storage node; and
   a sensing line configured to be activated in a reading mode of the MRAM cell, thereby creating data reading information based on a voltage between the first and second MTJs.

2. The MRAM cell according to claim 1, wherein:
   the first MTJ comprises:
     a first free layer formed at a side of the bit line;
     a first pinned layer formed at a side of the second MTJ; and
     a first insulating layer formed between the first free layer and the first pinned layer; and
   the second MTJ comprises:
     a second free layer formed at a side of the bit line bar;
     a second pinned layer formed at a side of the first MTJ; and
     a second insulating layer formed between the second free layer and the second pinned layer.

3. The MRAM cell according to claim 2, wherein the first and second MTJs have different ones of a low resistance state (LRS) and a high resistance state (HRS), respectively, in accordance with a voltage drop direction between the bit line and the bit line bar, thereby storing data of 0 or 1.

4. The MRAM cell according to claim 1, wherein the sensing line comprises:
   a second NMOS transistor configured to receive the voltage between the first and second MTJs at a gate thereof and connected to a ground at a source thereof; and
   a load resistor connected, at one side thereof, to a drain of the second NMOS transistor and configured to receive power at another side thereof in the reading mode of the MRAM cell.

5. The MRAM cell according to claim 4, wherein the other side of the load resistor is connected to the ground in a writing mode of the MRAM cell.

6. The MRAM cell according to claim 4, wherein:
   the second NMOS transistor is turned on when the first MTJ is in the LRS, and the second MTJ is in the HRS, thereby creating data-1 reading information; and
   the second NMOS transistor is turned off when the first MTJ is in the HRS, and the second MTJ is in the LRS, thereby creating data-0 reading information.

7. A memory device using a magnetoresistive random access memory (MRAM) cell, the memory device comprising:
   a plurality of MRAM cells 100 disposed in an m×n matrix;
   a word line driver configured to generate m word line voltages for determination of operation modes of corresponding ones of the MRAM cells; and
   a control voltage generator configured to generate a control voltage for control of an operation of each of the MRAM cells and determination of data to be stored in each of the MRAM cells, the control voltage comprising n bit line voltages and n bit line bar voltages, wherein each of the MRAM cells comprises:
a switch unit configured to determine opening and closing thereof by a corresponding one of the word line voltages and to activate a current path between a bit line and a bit line bar in an opened state thereof;
a storage node comprising first and second magnetic tunnel junctions (MTJs) having opposite states, respectively, the first and second MTJs being connected in series between the bit line and the bit line bar; and
a sensing line configured to be activated in a reading mode of the MRAM cell, thereby creating data reading information based on a voltage between the first and second MTJs.

8. The memory device according to claim 7, wherein, when the MRAM cell is in a writing mode:
for writing of data of 1 in the storage node, the control voltage generator generates a first bit line voltage and a first bit line bar voltage such that a voltage drop is generated in a direction from the bit line to the bit line bar; and
for writing of data of 0 in the storage node, the control voltage generator generates a second bit line voltage and a second bit line bar voltage such that a voltage drop is generated in a direction from the bit line bar to the bit line.

9. The memory device according to claim 8, wherein:
when the MRAM cell is in the reading mode, the control voltage generator generates a third bit line voltage and a third bit line bar voltage such that a voltage drop is generated in the direction from the bit line to the bit line bar; and
the third bit line voltage has a lower level than the first bit line voltage.

10. The memory device according to claim 9, wherein the control voltage generator connects the first bit line bar voltage, the second bit line bar voltage and the third bit line bar voltage to a ground.

11. The memory device according to claim 7, wherein:
the first MTJ comprises:
a first free layer formed at a side of the bit line;
a first pinned layer formed at a side of the second MTJ; and
a first insulating layer formed between the first free layer and the first pinned layer; and
the second MTJ comprises:
a second free layer formed at a side of the bit line bar;
a second pinned layer formed at a side of the first MTJ; and
a second insulating layer formed between the second free layer and the second pinned layer.

12. The memory device according to claim 11, wherein the first and second MTJs have different ones of a low resistance state (LRS) and a high resistance state (HRS), respectively, in accordance with a voltage drop direction between the bit line and the bit line bar, thereby storing data of 0 or 1 in the storage node.

13. The memory device according to claim 7, wherein the sensing line comprises:
a second NMOS transistor configured to receive the voltage between the first and second MTJs at a gate thereof and connected to a ground at a source thereof; and
a load resistor connected, at one side thereof, to a drain of the second NMOS transistor and configured to receive power at another side thereof in the reading mode of the MRAM cell.

14. The memory device according to claim 13, wherein the other side of the load resistor is connected to the ground in a writing mode of the MRAM cell.

15. The memory device according to claim 13, wherein:
the second NMOS transistor is turned on when the first MTJ is in the LRS, and the second MTJ is in the HRS, thereby creating data-1 reading information; and
the second NMOS transistor is turned off when the first MTJ is in the HRS, and the second MTJ is in the LRS, thereby creating data-0 reading information.

\* \* \* \* \*